(12) United States Patent
Van Buskirk et al.

(10) Patent No.: US 11,977,106 B2
(45) Date of Patent: May 7, 2024

(54) SYSTEM FOR PROVIDING QUANTITATIVE ENERGY EFFICIENCY METRICS

(71) Applicant: Enervee Corporation, Culver City, CA (US)

(72) Inventors: Robert Van Buskirk, Berkeley, CA (US); Richard Busby, Los Angeles, CA (US); Matthias Kurwig, Los Angeles, CA (US)

(73) Assignee: Enervee Corporation, Culver City, CA (US)

( * ) Notice: Subject to any disclaimer, the term of this patent is extended or adjusted under 35 U.S.C. 154(b) by 344 days.

(21) Appl. No.: 17/388,951

(22) Filed: Jul. 29, 2021

(65) Prior Publication Data

US 2022/0034948 A1 Feb. 3, 2022

Related U.S. Application Data

(60) Provisional application No. 63/059,418, filed on Jul. 31, 2020.

(51) Int. Cl.
*G01R 21/133* (2006.01)
*H04L 67/133* (2022.01)
(52) U.S. Cl.
CPC .......... *G01R 21/133* (2013.01); *H04L 67/133* (2022.05)

(58) Field of Classification Search
CPC ................ G01R 21/133; H04L 67/133; G06Q 10/0639; G06Q 30/0201; G06Q 50/06; G06Q 30/0282
See application file for complete search history.

(56) References Cited

U.S. PATENT DOCUMENTS

| | | | |
|---|---|---|---|
| 2012/0216123 A1* | 8/2012 | Shklovskii | G06Q 30/0201 715/738 |
| 2015/0207316 A1* | 7/2015 | Saussele | H02J 3/381 700/287 |
| 2017/0242940 A1* | 8/2017 | Yu | G06Q 10/0637 |
| 2017/0285079 A1* | 10/2017 | Duncan-Wilson | G06Q 30/0201 |
| 2018/0031618 A1* | 2/2018 | Friedlander | G01R 31/343 |
| 2018/0196094 A1* | 7/2018 | Fishburn | G01R 21/133 |
| 2019/0377013 A1* | 12/2019 | Duncan-Wilson | G06Q 50/06 |
| 2020/0380184 A1* | 12/2020 | Hoff | G06F 17/10 |
| 2021/0334677 A1* | 10/2021 | Zeng | G06N 5/04 |
| 2023/0104246 A1* | 4/2023 | Jeyapaul | G06N 3/082 713/320 |

* cited by examiner

*Primary Examiner* — John E Breene
*Assistant Examiner* — Yaritza H Perez Bermudez
(74) *Attorney, Agent, or Firm* — Frost Brown Todd LLP

(57) ABSTRACT

A system and method of analyzing, manipulating, and combining various items of resource consuming device ("RCD") performance information to produce quantitative metrics usable to rank or compare RCDs. The method can apply to RCDs such as cars, appliances, residential households or electronics.

20 Claims, 5 Drawing Sheets

SYSTEM FOR PROVIDING QUANTITATIVE ENERGY EFFICIENCY METRICS

PRIORITY

This application claims the priority of U.S. Pat. App. 63/059,418, filed Jul. 31, 2020, the entire disclosure of which is incorporated herein by reference.

TECHNICAL FIELD

Embodiments of the technology relate, in general, to systems, apparatuses and methods for providing quantitative energy efficiency metrics for devices.

BACKGROUND

Efficient utilization of resources can lead to both economic growth and environmental improvement. Thus technical improvements in representing consumption efficiency of consumer and commercial devices (e.g., home appliances, climate control equipment, multimedia equipment, vehicles) for almost any resource whose consumption can be measured (e.g., electrical power, various types of fuel) can also lead to economic growth and environmental improvement.

DETAILED DESCRIPTION

Figure 1:
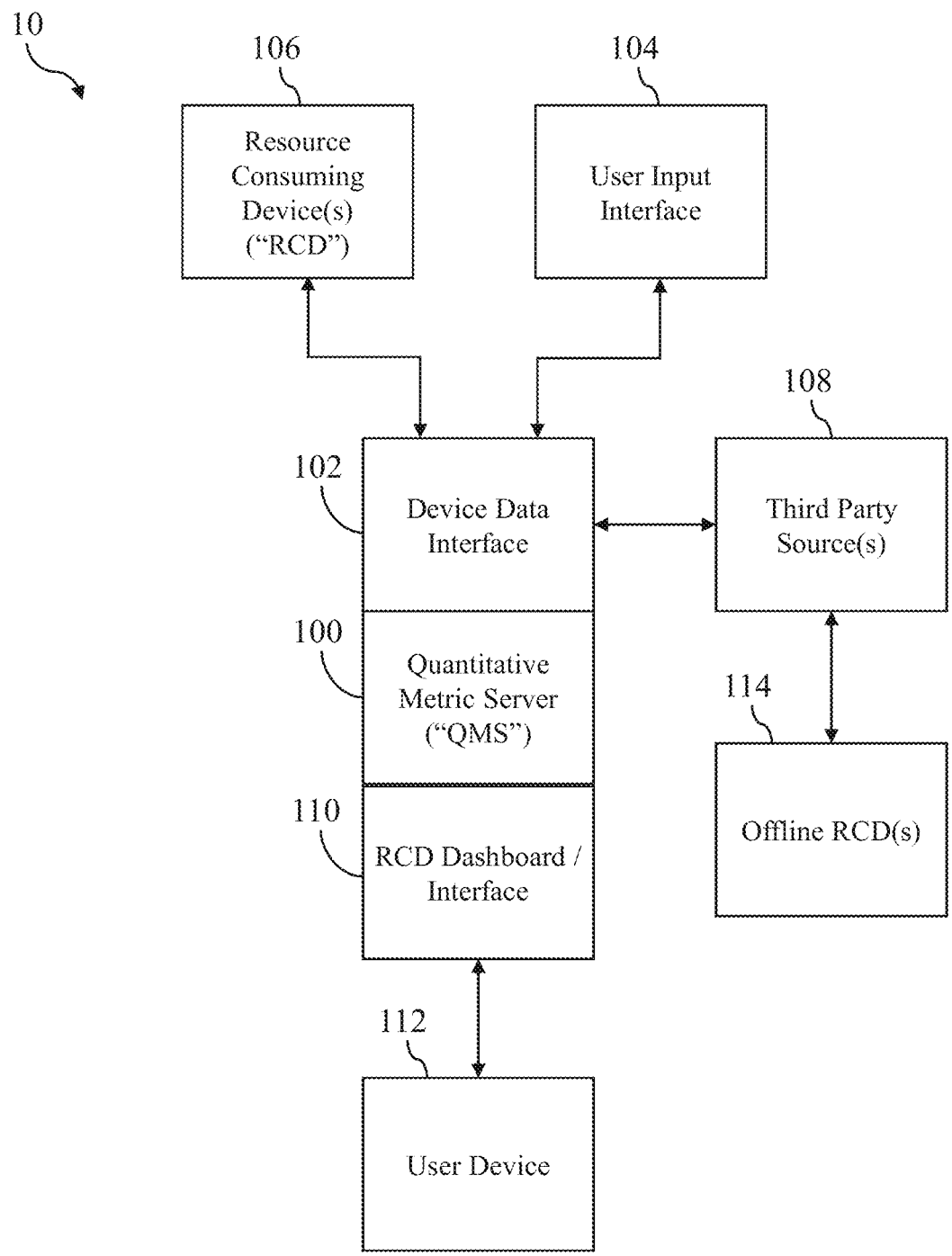
FIG. 1 is a schematic diagram of an exemplary system for producing quantitative energy efficiency metrics.

Various non-limiting embodiments of the present disclosure will now be described to provide an overall understanding of the principles of the structure, function, and use of the apparatuses, systems, methods, and processes disclosed herein. One or more examples of these non-limiting embodiments are illustrated in the accompanying drawings. Those of ordinary skill in the art will understand that systems and methods specifically described herein and illustrated in the accompanying drawings are non-limiting embodiments. The features illustrated or described in connection with one non-limiting embodiment may be combined with the features of other non-limiting embodiments. Such modifications and variations are intended to be included within the scope of the present disclosure.

Reference throughout the specification to "various embodiments," "some embodiments," "one embodiment," "some example embodiments," "one example embodiment," or "an embodiment" means that a particular feature, structure, or characteristic described in connection with any embodiment is included in at least one embodiment. Thus, appearances of the phrases "in various embodiments," "in some embodiments," "in one embodiment," "some example embodiments," "one example embodiment," or "in an embodiment" in places throughout the specification are not necessarily all referring to the same embodiment. Furthermore, the particular features, structures or characteristics may be combined in any suitable manner in one or more embodiments.

The examples discussed herein are examples only and are provided to assist in the explanation of the apparatuses, devices, systems and methods described herein. None of the features or components shown in the drawings or discussed below should be taken as mandatory for any specific implementation of any of these the apparatuses, devices, systems or methods unless specifically designated as mandatory. For ease of reading and clarity, certain components, modules, or methods may be described solely in connection with a specific figure. Any failure to specifically describe a combination or sub-combination of components should not be understood as an indication that any combination or sub-combination is not possible. Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

Technical solutions to the problems associated with representing meaningful (e.g., non-arbitrary, quantitative) energy consumption data can be achieved by the systems, apparatuses and methods of the present disclosure. The disclosed systems, apparatuses and methods provide quantitative metrics related to energy or other resource consumption and can be applied to nearly any energy or resource consuming device ("RCD"). When described herein, resources should be understood to include electrical power, various fuels, and in some implementations may also include other resources that are discarded or unusable after use with a RCD, even where they do not undergo a change in form or composition (e.g., such as water that is used by a washing machine and then disposed as waste water). Such metrics increase the amount of information available when selecting RCDs for personal or commercial use, while simultaneously minimizing resource consumption externalities.

In general, the systems, apparatuses and methods provide a simple and clear, yet sufficiently differentiated, ranking for RCDs in an identified category by providing quantitative metrics that may be expressed as raw data, related to a visual or numeric scale, or both. The metrics describe a specific performance attribute which can be rank ordered with metrics of other RCDs in the identified category for comparison. Certain exemplary embodiments of the present disclosure are provided herein.

According to an exemplary embodiment, the present invention provides a method of analyzing, manipulating, and combining various items of RCD performance and attribute information to provide comparable quantitative metrics. The method can apply to almost any type of RCD, including cars (e.g., both internal combustion engines and electrical motors), appliances, electronics, and may also be applied to both micro and macro categories therein (e.g., such as where a residential household is evaluated as a single RCD that is representative of multiple RCDs operating within or in relation to that household). For ease of understanding, an exemplary embodiment of the methodology will be described with reference to the category of appliances (e.g., refrigerator, electrical or gas dryer, washing machine) however, the method described herein can apply generally across multiple categories of items. One of ordinary skill in the art will understand, however, that variations may be necessary to tailor the process to certain items.

An exemplary embodiment of the method creates a metric or set of metrics for one or more items. The items can all be within a similar category. For example, with respect to any category of appliances such as "refrigerators", the method may also create a set of metrics for sub-categories of refrigerators such as "compact refrigerators" or for "top-freezer refrigerators."

Collection of RCD Attribute and Valuation Data

Turning now to the figures, FIG. 1 shows a system (10) that includes a quantitative metric server ("QMS") (e.g., a physical server, cloud server, virtual server, or other computing environment) that is configured to receive input metrics and other data associated with RCDs, analyze input data to produce further quantitative metrics for the RCDs, and provide quantitative metrics of RCDs as raw data, scaled data, or in various other forms (e.g., such as a graphical user interface of a software application or web browser). The QMS (100) includes a device data interface (102) that requests and/or receives data associated with RCDs, and may be, for example, a software API, FTP interface, or other communication channel. As an example of data sources in communication via the device data interface (102), user interfaces (104) allow for data input (e.g., software applications, web services, or other interactive user experiences), and may include a prompt to the user for input and, in the case of quantitative inputs, may restrict and require that input to be provided and received in strongly typed forms. Other examples of sources that may be in communication with the device data interface (102) include third party data sources (108), such as a manufacturer of RCDs that can push or provide input data for their respective RCDs to the QMS upon request or on regular schedules. In some implementations, third party data sources (108) may provide data that is associated with offline RCDs (114) (e.g., an RCD that is not configured to self-report metrics), and may include official government registries of RCD capacity or service output, laboratory metrics of RCD performance, or field metrics of RCD performance. Sources may also include RCDs (106) themselves, in the case of RCDs that include processors, memories, communication devices, sensors, and other components in order to self-produce input data and/or self identify their capabilities relating to the use of resources.

The QMS (100) may produce and store quantitative metrics based on the inputs in an ongoing basis or based on certain schedules, and may also store the input data itself allowing for the entire set of quantitative metrics to be refactored based upon additional/different information that may become available over time. Produced quantitative metrics may be provided via a RCD dashboard or interface (110), which may be a software API that provides requested data to other software applications or systems, or may be a user facing dashboard such as may be displayed to a user device (112) (e.g., a personal computer, mobile phone, tablet computer, or other computing device) via a web browser or native software application.

Input data for RCDs in a particular RCD category such as "refrigerators" can be collected from a variety of sources using automated or manual means, as described above. The data collected may include additional information beyond quantitative metrics describing resource consumption (e.g., for an air conditioner, watt-hours), such as an identifier for the RCD model or type, quantitative attributes or characteristics associated with the RCDs use of resources (e.g., for an air conditioner, BTU), and other information relating to the RCD such as a release date, territory of availability, and otherwise. In some implementations, RCD attributes to be collected may be restricted to only those attributes that may be expressed as a quantitative metric, and that are correlated with variations in RCD resource use (e.g., for an air conditioner, BTU), which may be generally referred to herein as "capacity," as a description of the RCDs capability or capacity for providing some benefit that is directly related to consumption. The collected data can be stored by the QMS (100), and can be collected for all RCDs as they become available from data sources (104, 106, 108).

Collection of Resource Use Data

Data for RCDs in a particular RCD category such as "refrigerators" can be collected from a variety of sources (104, 106, 108) using automated or manual means. The data collected includes an identifier for the RCD model, any RCD attributes associated with the resource use of the model, and metrics related to RCD resource use or resource efficiency. Sources (108) of data can include official government registries of RCD resource use or efficiency, laboratory metrics of resource use, or field metrics of resources use. Data can also include resource use estimates that are calculated or derived from other RCD performance data, such as from direct connected RCDs (106). The collected data can be stored by the QMS (100). For RCDs such as an air conditioner or a "single family home" which have resource consumption that varies seasonally or over time, the resource data can be collected for each time period and for different devices and components in the home, and the final metric or rating varies over time and varies with the devices or components in the home. In such an example, occupancy or square footage, or use characteristics can be an attribute that is collected for the RCD.

Collection of Capacity Data

Additional data for RCDs in a particular RCD category such as "refrigerators" can be collected from a variety of sources using automated or manual means that is related to RCD capacity. The data collected includes an identifier for the RCD model, any quantitative RCD attributes or metrics associated with the amount of service that the model provides to the user. Sources of data can include official government registries of RCD capacity or service output, laboratory measurements of RCD performance, or field measurement of RCD performance. Data can also include RCD performance estimates that are calculated or derived from other RCD attribute data, such as from directly connected RCDs (106) that may report quantitative data on their actual capacity in real time, or quantitative data describing their configured capabilities as may be stored locally on the RCD at the time of manufacture (e.g., a computer processor may store information identifying its own ideal clock rate).

Associating RCD Capacity Data with RCD Resource Use Data

Data sources for RCD capacity data can be different from data sources for RCD consumption data. Data for RCD capacity can be associated with RCD consumption by matching RCD model identifiers. If RCD model identifiers do not match, automated or manual means can be used to match RCD models that are made by the same manufacturer and that have the same or very similar RCD attributes.

Analysis of RCD Capacity and Resource Use Data to Produce a Service Output Function A calculation of RCD output as a function of RCD capacity can be analytically estimated from a combination of RCD resource use and RCD capacity that is different for different RCD types. When data is collected on RCD capacity and resource use, data is also collected related to RCD service output. A person skilled in the relevant art will be familiar with regression and other statistical and analytical techniques for estimating the RCD service output vs capacity function. Such analysis will include outlier detection and other techniques for performing data quality assurance and data error detection on analysis inputs.

Analysis of RCD Resource Use and RCD Service Output to Produce a RCD Efficiency Estimate A calculation of RCD efficiency is made by calculating the ratio of RCD service output to RCD resource use. Alternatively, estimates of RCD efficiency may be available from official government registries or other sources. RCD efficiency may be estimated from RCD attributes when specific RCD efficiency data is not available. A person skilled in the relevant art will be familiar with regression and other statistical techniques for selecting or integrating RCD efficiency estimates from different sources and from RCD attributes. Such analysis will include outlier detection and other techniques for performing data quality assurance and data error detection on analysis inputs.

Analysis of RCD Efficiency to Produce a RCD Efficiency vs Capacity Function

A calculation of RCD efficiency as a function of RCD capacity can be statistically estimated using standard regression techniques. A person skilled in the relevant art will be familiar with regression and other statistical techniques for estimating the RCD efficiency vs capacity function. Such analysis will include outlier detection and other techniques for performing data quality assurance and data error detection on analysis inputs.

Analysis of RCD Resource Use to Produce a RCD Resource Use vs Capacity Function

A calculation of RCD resource use as a function of RCD capacity can be statistically estimated using standard regression techniques. A person skilled in the relevant art will be familiar with regression and other statistical techniques for estimating the RCD resource use vs capacity function. Such analysis will include outlier detection and other techniques for performing data quality assurance and data error detection on analysis inputs.

Ranking RCDs Based on a Relative Resource Use Efficiency

The relative resource use efficiency for each RCD can be calculated as the ratio of the value obtained from the efficiency vs. capacity function when an individual RCD's capacity is input into the function, and estimated efficiency of the individual RCD obtained from collected data. All RCDs in a particular category or market may be compared based upon their relative resource use efficiency (e.g., consumption of resource relative to magnitude of capacity).

Conversion of RCD Comparable Data

In some implementations, the output from comparisons of RCD data (e.g., a rank metric function) can be smoothed and rescaled by fitting the relative efficiency vs. rank function to a smooth curve. A person skilled in the relevant art can test the empirical data against a range of possible functional forms and select that functional form and fit that fits the empirical data in the most desirable way, where the qualities of a desirable curve fit can be determined by the skilled person.

The above-described embodiments can be practiced in the following steps as a method on a system, including a Software as a Service (SaaS) system and associated apparatuses: (1) Receiving input data on RCD attributes, resource use and RCD capacity using internet-based data collection techniques; (2) Performing a standard regression analyses to estimate functions of resource use vs RCD capacity; (3) Estimating the function that relates RCD capacity to RCD service output; (4) Calculating RCD efficiency as the ratio of RCD service output to RCD resource use; (5) Estimating the function that relates RCD efficiency to RCD capacity through regression analysis; (6) Estimating for each RCD in the market the ratio between RCD-specific values efficiency and the functions of efficiency vs. capacity determined through regression analysis; (7) Ranking an individual RCD based on ratio of the regression function estimate of efficiency evaluated at RCD capacity to the individual RCD resource use data. This ratio is the relative resource use efficiency of the RCD; and (8) Conversion of the ranking into a smoothed, rescaled quantitative metric by applying a rank vs. metric function.

The methodology and system described herein permits uniform calculation of quantitative metrics that is meaningful across a plurality of RCD categories. The quantitative metrics for a RCD can reflect the RCD's energy efficiency by putting the RCD's energy consumption in relation to its specific performance, such as RCD attributes (e.g., BTU output, television screen size, refrigerator interior volume).

In an embodiment, a metric scale for an array of RCDs can include defining the metrics for current RCDs being produced to be from 50 to 100 (e.g., or another value corresponding to the quantitative efficiency metrics), with metrics of 0-49 (e.g., or another value corresponding to the quantitative efficiency metrics) being reserved for older RCD models no longer being produced. A description on a visible metric scale can define RCDs falling in lower metric ranges as being "older models;" RCDs falling in moderate ranges as being "fairly efficient;" and RCDs falling in high ranges as being "very efficient." Of course, the range and nomenclature for RCDs can be manipulated as desired, with the end result being that certain models are associated with quantitative metrics higher or lower on the scale relative to other models of a given RCD category.

Figure 4:
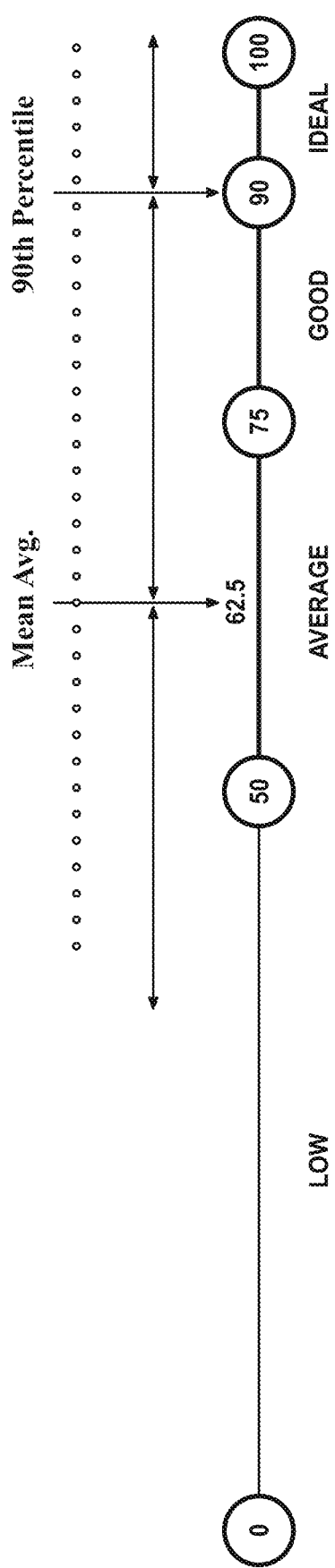
FIG. 4. is a visual representation of one output of a methodology of the present disclosure.
Figure 5:
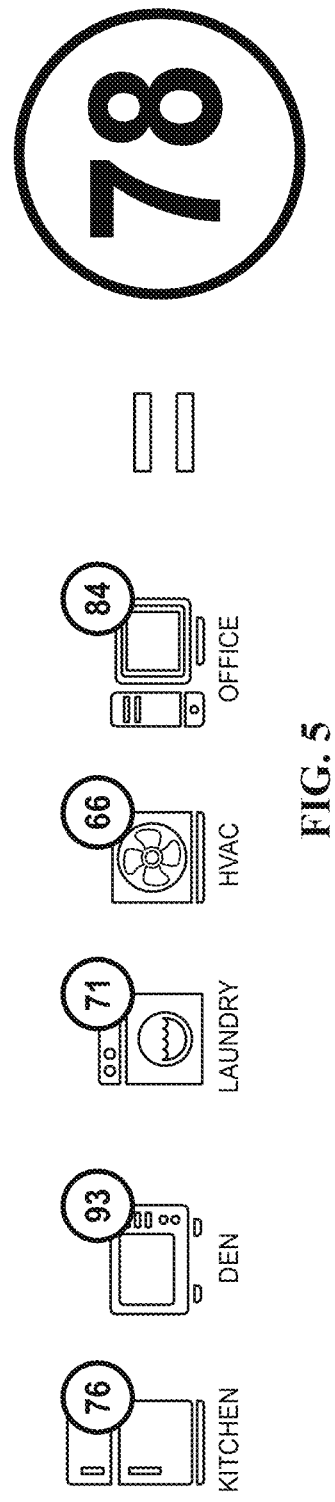
FIG. 5 is a chart indicating certain attributes of a methodology of the present disclosure.

In an embodiment, an efficiency metric can be calculated by dividing the capacity attribute(s) by the annual energy consumption and then distributing all the RCDs in a category on a shared scale. In one such embodiment, the RCD capacity may be proportional to the RCD service output. In an embodiment, all the currently produced RCDs in a category would be associated with metrics on a scale of 50-100 (e.g., or another value corresponding to the quantitative efficiency metric). A typical graphical representation of such a metric is depicted in FIG. 4.

Table 1 below illustrates an example calculation of quantitative metrics usable for ranking televisions, with screen size as a capacity ranking attribute.

TABLE 1

Exemplary quantitative television efficiency metric

Screen size (Capacity): 40 inches
Energy Consumption: 180 W operationally; 2 W standby
Average usage: 5 hours/day
Calculation:
Energy consumption: (180 W × 5 + 2 W × 19) × 365/1000 = 342.37 kWh/yr
Efficiency (unscaled): 40/342.37 = 0.01168326664

An example calculation for efficiency of a thermostat, with no adjustment for capacity characteristic is shown below in Table 2.

TABLE 2

Exemplary quantitative thermostat efficiency metric

Programmable attribute: YES: 3% savings out of 3% possible
Time of Use attributes (A total 6% savings possible):
    >4 programmable periods per day: YES: 2.59% out of 2.59% possible
    Phone controlled or smart hub enabled: YES: 1.95% out of 1.95% possible
    Hourly programmable: YES: 1.46% out of 1.46% possible
Efficiency attributes (A total of 6% savings possible)
    Phone controlled or smart hub enabled: YES: 1.82% out of 1.82% possible
    Occupancy sensor or vacation mode: YES: 1.37% out of 1.37% possible
    Smart home agent enabled (e.g. Alexa, Siri): YES: 1.03% out of 1.03% possible
    Geofencing: NO: 0% out of 0.77% possible
    HVAC condition or filter indicator: NO: 0% out of 0.58% possible
    Wi-Fi, Bluetooth, or Z-wave enabled: YES: 0.43% out of 0.43% possible
Demand-Response attributes (A total of 2% savings possible)
    Demand-response enabled: NO: 0% out of 1.14% possible
    Phone controlled or smart hub enabled: YES: 0.86% out of 0.86% possible
Total attribute-based savings: 14.51% out of 17% possible
Calculation:
    Efficiency = 1/(1 − TOTAL_SAVINGS) = 1.170

An example calculation of an efficiency for ranking refrigerators, with adjusted volume as a capacity attribute, is illustrated below in Table 3.

TABLE 3

Exemplary quantitative refrigerator efficiency metric

Fresh food volume: 19.8 cubic feet
Freezer volume: 8.7 cubic feet
Adjusted volume (CRA): 19.8 + (1.63 × 8.7) = 33.98
Energy Consumption: 492 kWh/yr
Average usage: included in Energy Consumption
Calculation:
    Efficiency (unscaled): 33.98/492 = 0.0690650407

Figure 2:
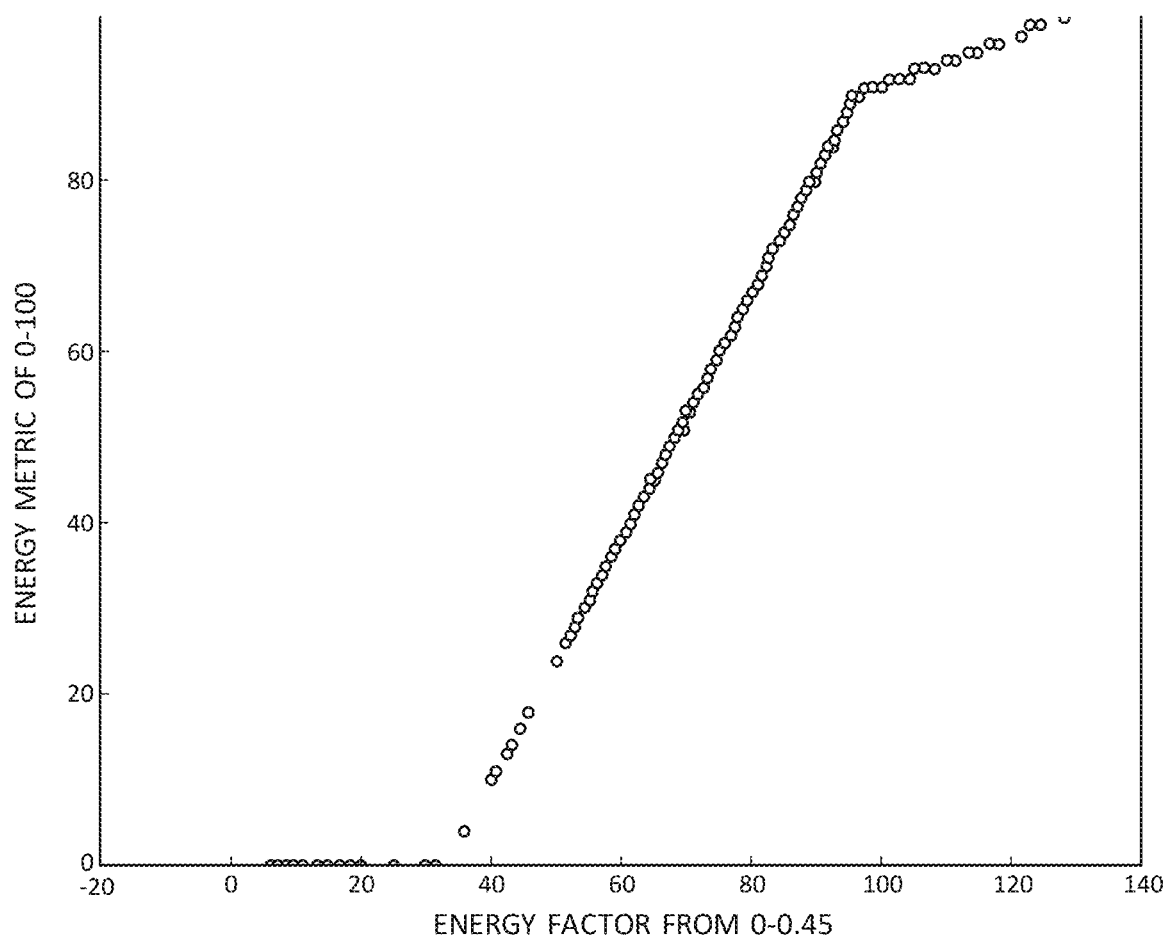
FIG. 2. is a graphical representation of the energy efficiency of a representative resource consuming device ("RCD").

In an embodiment, the metrics described herein can be enhanced and made more meaningful to by scaling the data to a more meaningful function. For example, FIG. 2 shows a typical scaling of an energy metric of 0-100 vs an energy factor from 0 to 0.45 from the $90^{th}$ percentile to a maximum value of efficiency. The curve shown in FIG. 2 is representative of actual data for light bulbs, but represents an example that can be applied to any RCD. As shown in FIG. 2, the raw data tends to be linear until the higher energy factors, at which time the curve flattens. The flattened portion of the curve shown in FIG. 2 tends to include the data most useful for consumer decision making.

Figure 3:
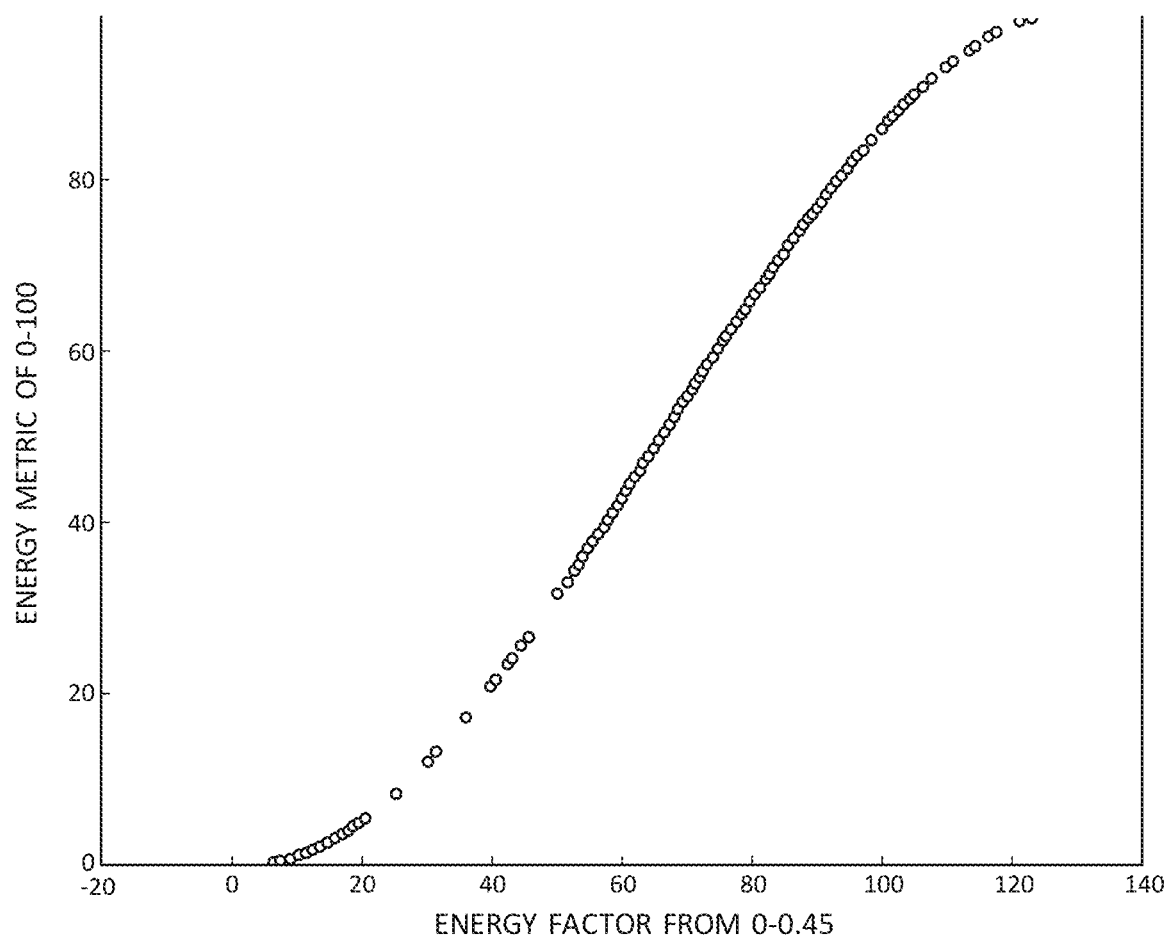
FIG. 3 is a curve-smoothed graphical representation of energy efficiency of the representative RCD of FIG. 2.

As depicted in FIG. 3, the raw metric data represented in FIG. 2 can be scaled to provide a metric function that more meaningfully represents extreme values, e.g., values close to 0 or 100. The curve also provides for handling historical (e.g., old, energy-inefficient) RCDs. The S-curve represented in FIG. 3 is fixed such that the median energy factor is close to 62.5 and a metric of 99.5 at the $4^{th}$ highest efficiency value. In this manner, a rounded metric will be 100 for a defined number of RCDs, such as four RCDs. In an embodiment, the S-curve can be generated as a smooth-step function.

Further scaling manipulation can offer more meaningful metrics, particularly for RCDs in which significant differences in energy efficiency do not reflect comparable differences in the final rank metric. For example, for certain RCDs, such as electric clothes dryers in the United States, RCDs having the highest combined energy factors tend to "bunch" near the highest possible metric when graphed, for example, in a log-logistic curve.

It has been found that greater granularity among the most efficient of RCDs in a category can be achieved by splitting the RCD offerings between "high efficiency" RCDs and "everything else." For currently marketed RCDs, this greater granularity can be realized by the following method, provided as an example, and modifiable by one skilled in the art as desired: (1) Identify the third most efficient RCD in the category, considered to be the "top" efficiency; (2) Identify the 90th percentile efficiency in the category and assign to it a rank metric of 90; (3) Calculate two lines using set anchor points: (a) For the high efficiency RCDs, the two points used to determine the equation are: (i) the top efficiency set to a rank metric of 99.5, and (ii) the efficiency from step 2 above set to a rank metric of 90. (b) For the rest of the RCD offerings, the two anchor points can be used to determine the equation reflect (i) the lowest efficiency from the RCDs in high efficiency subset, anchored at a rank metric of 89, and (ii) the middle efficiency of the all the RCD offerings is anchored at a rank metric of 62.5.

A visual chart representation of the results achieved by the above methodology is depicted in FIG. 4. In an embodiment of the methodology, the calculation of the efficiency for any RCD was not altered. For example, if "clothes dryers" is the RCD category, all the clothes dryers are still associated with metrics based on pounds of clothes dried per unit energy consumed. Likewise, for example, if "televisions" is the category, each television metric is based on energy consumed and/or the screen size, or the like. Further, to make the rank work efficiently across all categories, including cars, for example, it may be desired to establish the trend for efficiency. For example, for some RCDs those with a lower efficiency factor were associated with higher metrics (e.g., U.S. refrigerators measured based on energy consumed per unit reference energy for the RCD based on its volume), whereas for others, a greater efficiency factor meant a higher metric (e.g., U.S. light bulbs measured based on lumens output per unit energy consumption). Therefore, in an embodiment, the rank metric scaling can be managed such that increasing order of the efficiency factor would reflect as an increasing order for rank. To achieve this goal, for categories that were originally sorted in decreasing order, the efficiency metric can be inverted. For example, the efficiency factor for refrigerators, in one embodiment, was changed to reference energy based on the volume per unit of actual annual energy consumption of the refrigerator.

An exemplary embodiment of the method creates a metric or set of metrics for one or more RCDs for which energy usage data is unavailable or incomplete. A ranking that facilitates a user's ability to evaluate RCDs based on otherwise hard-to-interpret, or hard-to-obtain, information can permit more thorough evaluation of RCDs. Thus, in an embodiment, a ranking can be calculated based on imprecise information as long as it nevertheless represents the best estimate of relative ranking of RCDs, such as RCD energy efficiency, based on the best information available for such a calculation. That is, it can still be very useful to have a RCD metrics or rankings that integrate the best expert information on how the RCD is likely to rank relative to other RCDs, even if that information is derived indirectly from RCD attributes and feature data that is not, for example, from government-generated efficiency databases.

In an embodiment, therefore, a generalized method for energy use and efficiency determination is disclosed for RCDs that use RCD feature and attribute data. The method can be described as follows. First, for every RCD category, the set of potentially relevant features is listed for that RCD category. Then for each feature or attribute, the following three steps are taken: (1) each feature is evaluated for relevance or influence with respect to capacity, energy use, both, or none; (2) a rationale and description of the relevance and quantitative impact of the feature is documented; and (3) an impact quantification methodology is described for incorporating the feature into the capacity or energy use estimates for the RCD—typically impact quantification will be formulated in terms of a multiplicative factor such as "feature X results in a 7% reduction in energy use." The impact quantification methodology includes a specification of dependencies on other feature data, any dependencies or conditions that have to be met for the calculation to be made, and what happens if data or inputs are missing. An example table of attribute impact evaluation for EV chargers is depicted in Table 4.

energy use vs. capacity relationship. Typically the reference energy use divided by the energy use of the RCD provides an "efficiency factor" that is used to rank the RCD efficiency relative to other RCDs in the market for the sake of comparison metrics.

In some implementations, when the more general case of multiple energy fuels are being considered, the energy may be converted to either dollars (or currency) spent or to emissions using fuel prices and fuel emissions factors, and the rankings with respect to money spent or emissions are recalculated, if cross-fuel comparisons are desired.

In an embodiment, a ranking metric can be applied to individuals, as well. For example, an individual person's rank metric can be the average of the rank metrics of all the RCDs a person uses. Individual rank metrics can be used, for example, in social media gamification. An example representation of an individual's rank metric is depicted in FIG.

TABLE 4

Exemplary attribute impact evaluation for EV chargers

| Attribute | Values | Relevance: E-Use, Capacity, Both, None | Impact | Quantification |
|---|---|---|---|---|
| Baseline E-Use | | Both | Simple, cheap, baseline condition | Estimate from typical driving behavior, unscheduled, Level 1 charging |
| Charging Voltage | 100 V 208 V, 220 V | Both | Voltage combined with current provides charging rate (capacity). Higher voltage decreases losses. | Assume baseline charge rate and losses and scale impact with standard electrical equations. |
| Charging Current | 15 A-200 A | Both | Current with voltage determines charging rate. Higher current leads to higher losses at some voltage. | Evaluate studies and available energy start data to create impact equation. |
| Cable Length | 14 ft-23 ft | E-Use | Cable length effects losses | Apply simple i-squared R factor. |
| Product Depth, Width, Height | | None | | |
| Indoor/Outdoor | | None | | |
| Mounting Type | | None | | |
| Remote Access | Y/N | E-Use | Remote access can allow for more efficient charging behavior. | Small multiplicative savings factor. |
| Energy Star Qualified | Y/N | E-Use | E-Star qualified will have lower stand by power and losses. | Significant multiplicative factor that depends on additional Energy Start parameters. |
| Smart Home Enabled | Y/N | E-Use | Can allow for more efficient charging behavior. | Small multiplicative factor. |
| Voice Activation Enabled | Y/N | E-Use | Can allow for more efficient charging behavior. | Small multiplicative factor. |

In addition to formulating those three data for each feature, the quantification methods for determining the energy capacity impacts of the features can, in some embodiments, be validated using two methods: (1) measurement of actual RCD energy use to estimate and validate correlations between RCD performance, energy use and attributes, and (2) solicitation of expert analysis of feature impact rationale and descriptions.

Once the equations for attribute-based capacity and energy use estimates are made for a set of RCDs, the correlation between capacity and energy use is examined to determine if there is a significant capacity vs. energy use relationship. If there is a significant relationship, then a reference function is calculated as described in previous embodiments, and for each RCD the energy use is estimated relative to the reference energy use from the reference

5. The individual's rank metric can be shared across social media websites and/or apps. In an embodiment, gamification can include a game in which persons attempt to have a higher rank metric than celebrities, friends, neighbors, or any other group of people.

Figure 6:
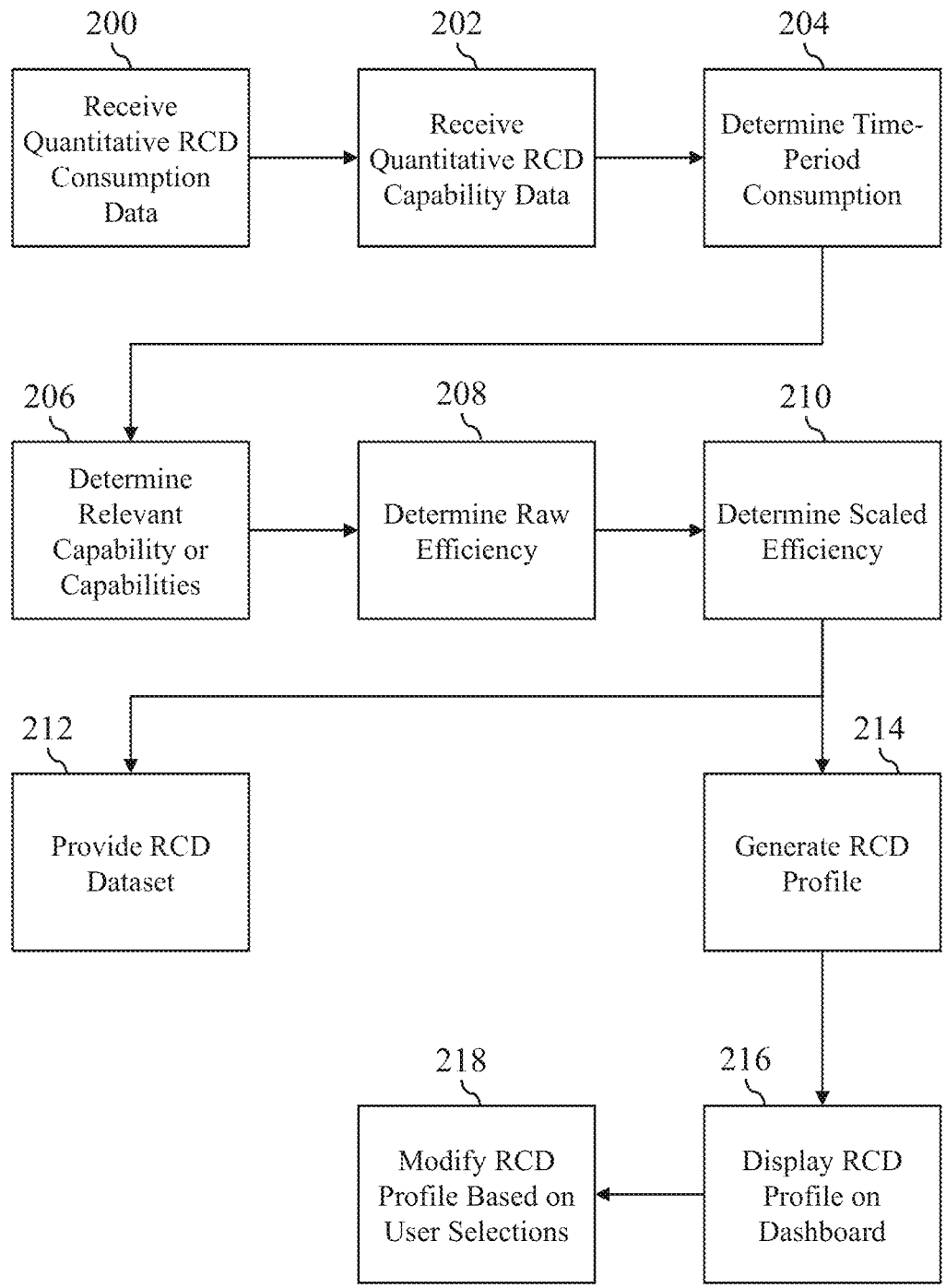
FIG. 6 is a flowchart of an exemplary set of steps that may be performed to produce quantitative energy efficiency metrics.

FIG. 6 is a flowchart of a set of steps that may be performed with a system such as that shown in FIG. 1 to provide quantitative RCD efficiency metrics. Quantitative RCD consumption data may be received (200) from third party sources, user inputs, or directly from RCDs as has been described. This may include information such as actual, average, or estimated consumption during use, average use per day or other time period, and other information relating to consumption of resources within various use scenarios. Quantitative RCD capability data may be received (202) from third party sources, user inputs, or directly from RCDs as has been described. This may include identifying information (e.g., a model number, serial number, or other description) that is usable to associate the RCD with a capability based upon a search of other information sources (e.g., a database of RCD capabilities with model number as a primary key), or may directly include capability information. In some implementations, capabilities may be parsed from model numbers, serial numbers, or other descriptions of the RCD. For example, where a particular manufacturer of RCDs includes some capabilities in the model number or serial number of a RCD, the system may be configured with rules to parse that information out (e.g., such as where a television manufactured by Sample Co., first produced in 2021, with a 75 inch screen, has a model number of TC-TV2021SS75). Capability information will typically describe a characteristic of the RCD that is both relevant to a user's experience with the RCD, and related to consumption of resources by the RCD. As an example, quantitative RCD capability data for an electric vehicle charger may include some or all of the attribute listed in Table 4 (e.g., voltage, current, remote access capable, smart home capable).

Consumption over a particular time period may be determined (204) based on the received (200) consumption data. Such information may already be directly stated within or factored in the consumption data, or may be determined for any selected or configured period of time (e.g., a day, month, or year) based on descriptions of Watt hours, Watts, cubic feet of gas, or other metrics. One or more relevant capabilities from the received (202) capability data may then be determined (206), which may include identifying any capabilities whose magnitude appears to be directly related to consumption based on statistical analyses such as described herein, excluding any capabilities that have little or no relation to consumption, or that are of little interest to potential users of the RCD, or a combination thereof. In some implementations, the determination (206) of one or more relevant capabilities may instead be a per-RCD category configuration (e.g., for televisions, the relevant capabilities may be manually configured as screen size (inches), and maximum screen brightness (lumen)).

A raw efficiency may be determined (208) based on the consumption data and relevant capabilities, such as in the examples shown in Tables 1-3. The raw efficiency is a quantitative metric that is based on quantitative inputs, and expresses consumption of a RCD relative to the magnitude of capabilities during such consumption. A scaled efficiency may also be determined (210) based on the quantitative raw efficiency. The scaled efficiency may be a numeric scale (e.g., such as 0-100) that directly corresponds to the raw efficiency, or may be expressed in various visual forms, such as graphs (e.g., such as shown in FIGS. 2-4), symbols, colors, or otherwise. Determination (210) of the scaled efficiency may also include additional scaling, smoothing, and distribution of the raw efficiency data, as has been described.

The quantitative raw efficiency data, the scaled efficiency data, or both may then be provided to users of the system (10) and other requesters. In some implementations, such data may be provided (212) as a RCD dataset in response to API requests via the RCD dashboard/interface (110). As an example, a vendor of RCDs may wish to present efficiency data on a website or other platform in relation to the marketing and sales of RCDs. As a visitor to the vendor website loads a product page for a particular RCD, a request may be made to the RCD interface (110) and the RCD Dataset may be provided (212) in response. Raw efficiency data may be selected from the dataset by the recipient and displayed in a desired manner, or scaled efficiency data or images may be selected from the dataset and presented directly without modification.

In some implementations, such data may be used to generate (214) a RCD profile that may be stored by the QMS (100) and displayed (216) to individual users via their user device (112) as a website, mobile application, or other user interface. Displayed data may include various quantitative data, as well as scaled data descriptions or visualizations. The system may also modify (218) and re-display the RCD profile to the user based on various user inputs. As an example, a user may select multiple RCDs to cause the interface to display (216, 218) a ranking interface or other comparison interface.

As another example, a user may select one or more capabilities of the RCD that are most relevant to that user (e.g., and that differ from the capabilities determined (206) previously) to cause the interface to display (216, 218) efficiency data that is refactored and based on those selected capabilities. As an example, where a user indicates that their most important features for a refrigerator are fresh food storage volume and ice production per hour, the raw efficiency may be refactored based on those criteria to show the user efficiency data relating to RCDs based solely on those selected capabilities, enabling the user to select the most efficient RCD relative to those two capabilities.

The foregoing description of embodiments and examples has been presented for purposes of illustration and description. It is not intended to be exhaustive or limiting to the forms described. Numerous modifications are possible in light of the above teachings. Some of those modifications have been discussed, and others will be understood by those skilled in the art. The embodiments were chosen and described in order to best illustrate principles of various embodiments as are suited to particular uses contemplated. The scope is, of course, not limited to the examples set forth herein, but can be employed in any number of applications and equivalent devices by those of ordinary skill in the art. Rather it is hereby intended the scope of the invention to be defined by the claims appended hereto.

What is claimed is:

1. A system for providing quantitative energy efficiency metrics for resource consuming devices ("RCD") comprising:
    (a) a server comprising a processor;
    (b) a RCD;
    (c) one or more sensors configured to track one or more consumption data and one or more capability data from the RCD;
    (d) a device data interface coupled to the processor and configured to receive the one or more consumption data and the one or more capability data from the one or more sensors; and
    (e) a RCD interface coupled to the server and configured to provide efficiency information to a user;
    wherein the processor is configured to:
        (i) receive the one or more consumption data, via the device data interface and determine a metric of resource consumption for the RCD based on the one or more consumption data;
        (ii) receive the one or more capability data, via the device data interface, and determine one or more capability metrics for the RCD based on the one or more capability data, wherein each of the one or more capability metrics describes the magnitude of a capability of the RCD;

(iii) determine a raw efficiency rating based on the metric of resource consumption and at least one capability metric of the one or more capability metrics;
(iv) create a RCD dataset based on the raw efficiency rating; and
(v) provide the RCD dataset to a recipient device via the RCD interface.

2. The system of claim 1, wherein the metric of resource consumption is a set of sensor data generated by a sensor of the RCD or sensors applied to the resource input of the RCD, and wherein the one or more consumption data is received from the RCD or from the sensors.

3. The system of claim 1, wherein the one or more capability metrics of the RCD are stored on a memory of the RCD, and wherein the one or more capability metrics are received from the RCD as part of the one or more capability data.

4. The system of claim 1, wherein the processor is further configured to, when determining the one or more capability metrics for the RCD:
select a subset of identifying information from the one or more capability data, wherein the subset of identifying information comprises information identifying a model of the RCD;
(ii) identify a set of model description data based on the model of the RCD; and
(iii) analyze the set of model description data to identify the one or more capability metrics for the RCD.

5. The system of claim 4, wherein the processor is further configured to, when identifying the set of model description data, request the set of model description data via an interface of a third party source.

6. The system of claim 1, wherein the processor is further configured to provide the RCD dataset to the recipient device as a response to an application programming interface request received via the RCD interface.

7. The system of claim 1, wherein the processor is further configured to, when providing the RCD dataset to the recipient device:
(i) generate a RCD profile based on the RCD dataset, wherein the RCD profile is configured to cause the recipient device to display a user interface that includes a scaled efficiency rating that:
(A) is based on the raw efficiency rating, and
(B) indicates a magnitude of the one or more capability metrics relative to a magnitude of the metric of resource consumption; and
(ii) provide the RCD profile to the recipient device.

8. The system of claim 7, wherein the RCD profile is further configured to cause the user interface to include a comparison of the scaled efficiency rating to scaled efficiency ratings for a plurality of other RCDs.

9. The system of claim 8, wherein the comparison includes a visual graph of a plurality of scaled efficiency ratings for the RCD and the plurality of other RCDs.

10. The system of claim 9, wherein the visual graph is configured as a scaled s-curve that accounts for a set of historical scaled efficiency ratings that fall below a median efficiency rating.

11. The system of claim 7, wherein the user interface is further configured to:
(i) receive a capability selection via the user interface, wherein the capability selection identifies a custom subset of the one or more capability metrics that is not equivalent to the at least one capability metric initially used to determine the raw efficiency rating;

(ii) determine a custom raw efficiency rating based on the custom subset;
(iii) determine a custom scaled efficiency rating based on the custom raw efficiency; and
(iv) display the custom scaled efficiency rating.

12. The system of claim 1, wherein the metric of resource consumption, the one or more capability metrics, and the raw efficiency rating are each quantitative values.

13. The system of claim 1, wherein the processor comprises one or more processors.

14. A method for providing quantitative energy efficiency metrics for resource consuming devices ("RCD") comprising:
(a) configuring a server to receive one or more consumption data and one or more capability data via a device data interface and provide efficiency information via a RCD interface;
(b) receiving, by a processor of the server, the one or more consumption data, via the device data interface, that includes a metric of resource consumption for a RCD;
(c) receiving, by the processor, the one or more capability data, via the device data interface, and determining one or more capability metrics for the RCD based on the one or more capability data, wherein each of the one or more capability metrics describes the magnitude of a capability of the RCD;
(d) determining, by the processor, a raw efficiency rating based on the metric of resource consumption and at least one capability metric of the one or more capability metrics;
(e) creating, by the processor, a RCD dataset based on the raw efficiency rating; and
(f) providing, by the processor, the RCD dataset to a recipient device via the RCD interface.

15. The method of claim 14, wherein the metric of resource consumption is a set of sensor data generated by a sensor of the RCD, and wherein the one or more consumption data is received from the RCD.

16. The method of claim 14, wherein the one or more capability metrics of the RCD are stored on a memory of the RCD, and wherein the one or more capability metrics are received from the RCD as part of the one or more capability data.

17. The method of claim 14, further comprising, by the processor and when determining the one or more capability metrics for the RCD:
(i) selecting a subset of identifying information from the one or more capability data, wherein the subset of identifying information comprises information identifying a model of the RCD;
(ii) identifying a set of model description data based on the model of the RCD; and
(iii) analyzing the set of model description data and identifying the one or more capability metrics for the RCD.

18. The method of claim 17, further comprising, by the processor and when identifying the set of model description data, requesting the set of model description data via an interface of a third party source.

19. The method of claim 14, wherein the processor comprises one or more processors.

20. A system for providing quantitative energy efficiency metrics for resource consuming devices ("RCD") comprising:

(a) a server comprising a processor;
(b) one or more sensors configured to track one or more consumption data and one or more capability data from the RCD;
(c) a device data interface configured to receive one or more consumption data and one or more capability data, wherein the device data interface communicatively couples the server with a RCD and a third party information source; and
(d) a RCD interface configured to provide efficiency information; wherein the processor is configured to:
  (i) receive the one or more consumption data from the one or more sensors that includes a metric of resource consumption for the RCD;
  (ii) receive the one or more capability data from the one or more sensors and determine one or more capability metrics for the RCD based on the one or more capability data, wherein each of the one or more capability metrics describes the magnitude of a capability of the RCD;
  (iii) when determining the one or more capability metrics for the RCD:
    (A) select a subset of identifying information from the one or more capability data, wherein the subset of identifying information comprises information identifying a model of the RCD;
    (B) receive a set of model description data from the third party information source based on the model of the RCD; and
    (C) analyze the set of model description data to identify the one or more capability metrics for the RCD;
  (iv) determine a raw efficiency rating based on the metric of resource consumption and at least one capability metric of the one or more capability metrics;
  (v) create a RCD dataset based on the raw efficiency rating; and
  (vi) provide the RCD dataset to a recipient device via the RCD interface.

* * * * *